(12) United States Patent
Faust et al.

(10) Patent No.: US 12,159,846 B2
(45) Date of Patent: Dec. 3, 2024

(54) PROCESS FLOW FOR FABRICATION OF CAP METAL OVER TOP METAL WITH SINTER BEFORE PROTECTIVE DIELECTRIC ETCH

(71) Applicant: Texas Instruments Incorporated, Dallas, TX (US)

(72) Inventors: Richard Allen Faust, Dallas, TX (US); Robert Martin Higgins, Plano, TX (US); Anagha Shashishekhar Kulkarni, Richardson, TX (US); Jonathan Philip Davis, Allen, TX (US); Sudtida Lavangkul, Murphy, TX (US); Andrew Frank Burnett, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/707,917

(22) Filed: Dec. 9, 2019

(65) Prior Publication Data
US 2021/0005560 A1    Jan. 7, 2021

Related U.S. Application Data

(60) Provisional application No. 62/869,410, filed on Jul. 1, 2019.

(51) Int. Cl.
*H01L 23/00* (2006.01)
*H01L 21/8234* (2006.01)

(52) U.S. Cl.
CPC ...... *H01L 24/03* (2013.01); *H01L 21/823475* (2013.01); *H01L 24/05* (2013.01); *H01L 2224/03009* (2013.01); *H01L 2224/03505* (2013.01); *H01L 2224/03614* (2013.01); *H01L 2224/03616* (2013.01); *H01L 2224/03848* (2013.01); *H01L 2224/05025* (2013.01);
(Continued)

(58) Field of Classification Search
CPC .......... H01L 24/03; H01L 2224/03505; H01L 2224/03009; H01L 2224/03011; H01L 2224/03013; H01L 2224/03019; H01L 2224/03848
See application file for complete search history.

(56) References Cited

U.S. PATENT DOCUMENTS

| | | | | |
|---|---|---|---|---|
| 4,505,029 A * | 3/1985 | Owyang | ................. | H01L 24/05 438/653 |
| 6,534,863 B2 * | 3/2003 | Walker | .............. | H01L 21/76865 257/784 |
| 6,821,877 B1 * | 11/2004 | Han | .................. | H01L 23/53219 257/E21.508 |
| 7,585,759 B2 * | 9/2009 | Kuechenmeister | ..... | H01L 24/05 216/13 |

(Continued)

FOREIGN PATENT DOCUMENTS

JP     5-47830    *  2/1993    ............. H01L 24/05

*Primary Examiner* — David A Zarneke
(74) *Attorney, Agent, or Firm* — Yudong Kim; Frank D. Cimino

(57) ABSTRACT

A method of forming a semiconductor device for improving an electrical connection. The semiconductor device includes a top metal layer. A protective dielectric layer is formed over the top metal layer. A sintering operation is performed while the top metal layer is covered by the protective dielectric layer. After the sintering operation, the protective dielectric layer is patterned to expose areas on the top metal layer for bond pads of the semiconductor device. A bond pad cap is formed on the top metal layer where exposed by the protective dielectric layer.

19 Claims, 6 Drawing Sheets

(52) U.S. Cl.
CPC ............... *H01L 2224/0508* (2013.01); *H01L 2224/05124* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05169* (2013.01); *H01L 2224/05181* (2013.01); *H01L 2224/05184* (2013.01); *H01L 2924/04941* (2013.01); *H01L 2924/04953* (2013.01); *H01L 2924/05442* (2013.01); *H01L 2924/059* (2013.01); *H01L 2924/20106* (2013.01); *H01L 2924/20107* (2013.01); *H01L 2924/20108* (2013.01); *H01L 2924/20109* (2013.01); *H01L 2924/2011* (2013.01)

(56) References Cited

U.S. PATENT DOCUMENTS

| | | | |
|---|---|---|---|
| 8,148,257 B1 * | 4/2012 | Barth | H01L 23/53266 |
| | | | 257/E21.585 |
| 8,586,480 B1 * | 11/2013 | Zommer | H01L 23/48 |
| | | | 438/686 |
| 9,202,793 B1 * | 12/2015 | Shim | H01L 24/03 |
| 9,620,466 B1 * | 4/2017 | Mischitz | H01L 21/02203 |
| 2005/0184305 A1 * | 8/2005 | Ueda | H01L 24/05 |
| | | | 257/99 |
| 2010/0051995 A1 * | 3/2010 | Katsuno | H01L 33/10 |
| | | | 257/98 |
| 2017/0294397 A1 * | 10/2017 | Croteau | H01L 24/27 |
| 2018/0033745 A1 * | 2/2018 | Cheng | H01L 23/5226 |
| 2018/0076165 A1 * | 3/2018 | Aoki | H01L 24/30 |
| 2020/0290833 A1 * | 9/2020 | Mita | H01L 24/83 |

\* cited by examiner

PROCESS FLOW FOR FABRICATION OF CAP METAL OVER TOP METAL WITH SINTER BEFORE PROTECTIVE DIELECTRIC ETCH

CROSS-REFERENCE TO RELATED APPLICATIONS

This application claims the benefit of priority under 35 U.S.C. § 119(e) of U.S. Provisional Application No. 62/869,410, filed Jul. 1, 2019, which is hereby incorporated by reference in its entirety.

FIELD

This disclosure relates to the field of semiconductor devices. More particularly, this disclosure relates to fabrication processes for semiconductor devices.

BACKGROUND

An integrated circuit may contain a palladium layer, for example as a cap layer of a bond pad at the top surface of the integrated circuit or as an interconnect element in the interconnect region. The palladium layer may be formed by forming a palladium layer in a recess in a dielectric layer, on the bond pad, followed by a chemical mechanical polish operation to remove unwanted palladium from the top surface, leaving palladium in the recess covering the bond pad. Voids or seams may develop in the palladium layer, which may allow contamination to damage the bond pad or underlying materials in the integrated circuit, leading to reliability degradation or device failure.

SUMMARY

The present disclosure introduces a method of forming a semiconductor device by using a sintering operation to stabilize underlying circuitry. The semiconductor device includes a top metal layer which is exposed at a top surface of the semiconductor device. A protective dielectric layer is formed over the top metal layer. A sintering operation is performed while the top metal layer is covered by the protective dielectric layer. The sintering operation, for example, includes heating the semiconductor device for a sinter thermal profile sufficient to passivate an active component of the semiconductor device. After the sintering operation, the protective dielectric layer is patterned to expose areas on the top metal layer for external connections to the semiconductor device. A cap metal layer is formed on the top metal layer where exposed by the protective dielectric layer.

DETAILED DESCRIPTION

Figure 2:
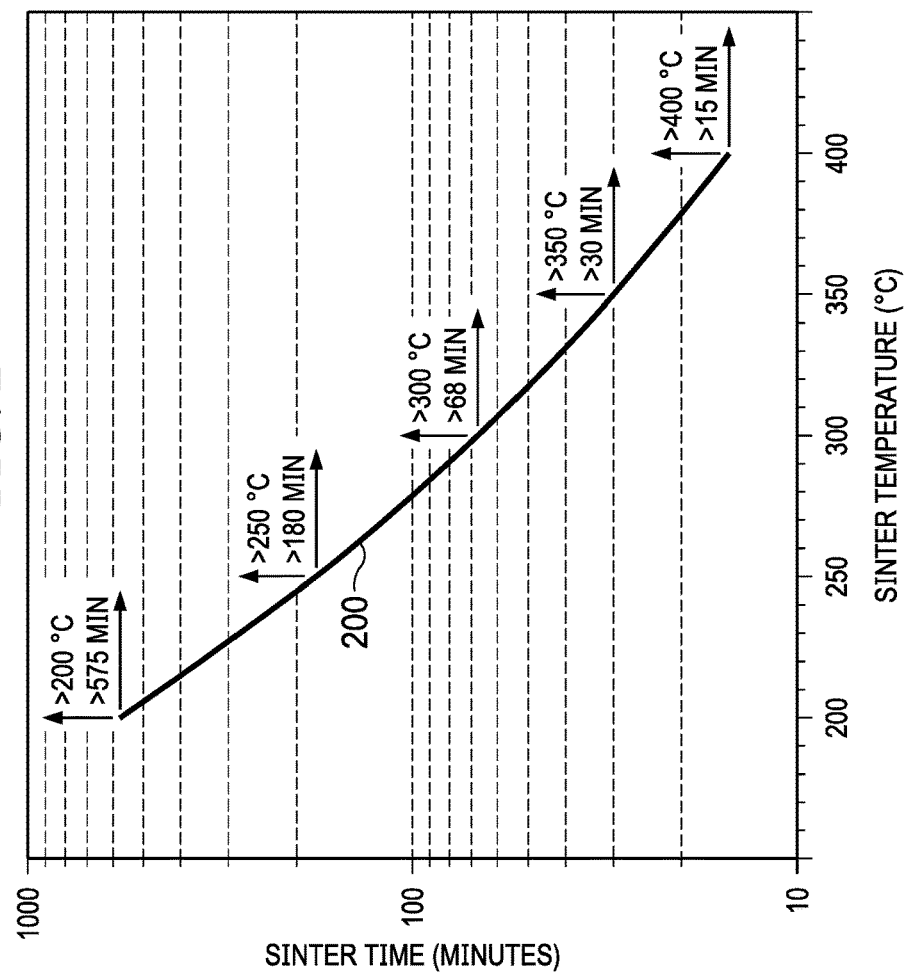
FIG. 2 is a chart of example sinter thermal profiles for the sintering operation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A semiconductor device includes a top metal layer, which is exposed at a top surface of the semiconductor device. The top metal layer includes bond pads. The top metal layer may include copper, aluminum, or tungsten, for example. A protective dielectric layer of the semiconductor device is formed over the top metal layer. The protective dielectric layer may include two or more sublayers, and may be at least 1 micron thick. The semiconductor device is heated by using a sintering operation while the top metal layer is covered by the protective dielectric layer. The sintering operation may be implemented to stabilize underlying circuitry. The sintering operation includes heating the semiconductor device for a sinter thermal profile sufficient to passivate an active component of the semiconductor device, that is, to improve electrical parameters of the active component. The sintering operation may include an ambient containing one or more of nitrogen, hydrogen, argon, or helium. The protective dielectric layer may reduce movement of grains in the top metal layer during the sintering operation, advantageously reducing hillocks or other defects in the top metal layer. After the sintering operation is completed, the protective dielectric layer is patterned to expose the bond pads on the top metal layer. A cap metal layer is formed on the top metal layer in the areas exposed by the protective dielectric layer. Reducing movement of grains in the top metal layer during the sintering operation, by having the protective dielectric layer cover the top metal layer in the areas for the external connections during the sintering operation, may advantageously reduce defects such as pinholes, voids, or seams, in the cap metal layer. The cap metal layer is subsequently patterned to form bond pad caps on the bond pads.

Figure 1:
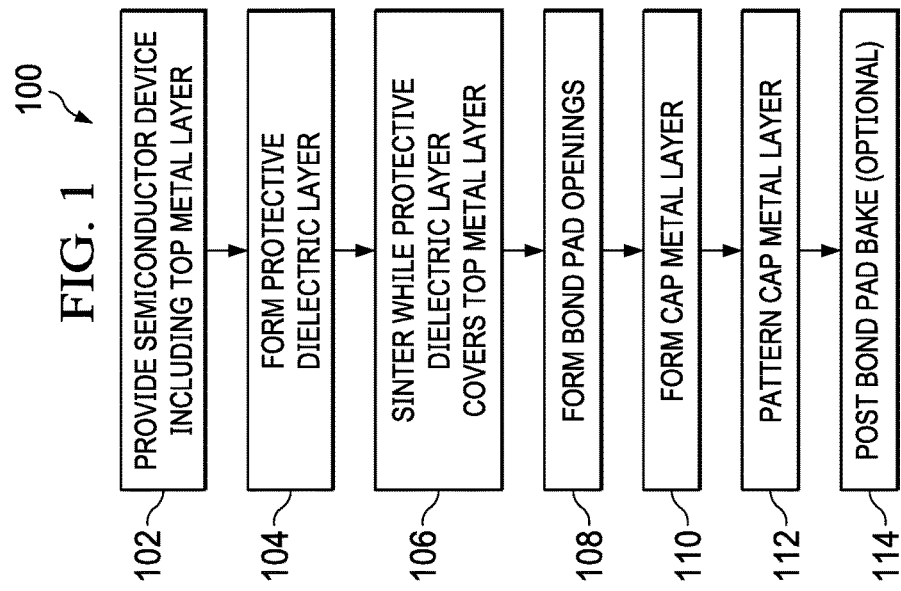
FIG. 1 is a flow diagram illustrating an example method for forming a semiconductor device in accordance with one or more aspects of the present disclosure.

FIG. 1 is a flowchart of an example method of forming a semiconductor device, according to one or more aspects of this disclosure. The method 100 begins with step 102, providing a device substrate that includes the unfinished semiconductor device, referred to hereinafter as the semiconductor device. The device substrate may be part of a semiconductor wafer containing additional unfinished semiconductor devices. The semiconductor device may be implemented as an integrated circuit or a discrete component, by way of example. Other implementations of the semiconductor device are within the scope of this example. The semiconductor device includes an active component, such as a transistor. The semiconductor device includes a top metal layer, which is exposed at a top surface of the semiconductor device. The top metal layer may be implemented as a bond pad level or an interconnect of a metallization level which includes bond pads, by way of example. In one version of this example, the top metal layer may include primarily aluminum, with a few weight percent of silicon, titanium, or copper, and may have an anti-reflection layer of titanium nitride. In another version, the top metal layer may include primarily copper. In a further version, the top metal layer may include primarily tungsten.

The method 100 continues with step 104, forming a protective dielectric layer over the top surface of the semiconductor device. The protective dielectric layer may include two or more sublayers of dielectric material, such as silicon dioxide, silicon nitride, silicon oxynitride, silicon carbide, or aluminum oxide. The protective dielectric layer is at least 1 micron thick, to provide mechanical support for the top metal layer during a subsequent sintering operation. The protective dielectric layer covers the top metal layer where exposed at the top surface of the semiconductor device.

The method 100 continues with step 106, performing a sintering operation while the protective dielectric layer covers the top metal layer. The sinter operation heats the semiconductor device for a sinter thermal profile sufficient to passivate the active component of the semiconductor device. The sinter thermal profile includes heating the semiconductor device to a sinter temperature for a sinter time, so that a product of the sinter time, in minutes, and an Arrhenius factor of the sinter temperature is greater than, or equal to, 0.0027 minutes. The Arrhenius factor of the sinter temperature is determined by the expression:

$$\text{Arrhenius factor} = \exp(-E_A/(k \times (375+T_s)))$$

where:
exp is the exponential function
$E_A = 0.8 \times 10^{-19}$ joules, corresponding to 0.5 electron volts
$k = 1.38 \times 10^{-23}$ joules/° C.
$T_s$ is the sinter temperature in ° C.

A chart of example sinter thermal profiles for the sintering operation is shown in FIG. 2. The curve 200 in FIG. 2 depicts sinter thermal profiles with products of the sinter time, in minutes, and the Arrhenius factor of the sinter temperature that are equal to 0.0027 minutes. Sinter thermal profiles on the curve 200 or above the curve 200 may be sufficient to passivate the active component of the semiconductor device. In one version of this example, the sinter thermal profile may include heating the semiconductor device to a sinter temperature of at least 400° C. for a sinter time of at least 15 minutes, as indicated in FIG. 2. In other versions of this example, the sinter thermal profile may include heating the semiconductor device to a sinter temperature of at least 350° C. for a sinter time of at least 30 minutes, or a sinter temperature of at least 300° C. for a sinter time of at least 68 minutes, or a sinter temperature of at least 250° C. for a sinter time of at least 180 minutes, or a sinter temperature of at least 200° C. for a sinter time of at least 575 minutes, as indicated in FIG. 2. The sintering operation also includes a temperature ramp up to the sinter temperature, and a ramp down from the sinter temperature to room temperature. During the sintering operation, grains in the top metal layer may tend to move to relax stresses. Having the full thickness of the protective dielectric layer over the top metal layer in areas for subsequently-formed external connections may reduce movement of the grains, advantageously reducing hillocks or other topographical defects in the top metal layer.

Referring back to FIG. 1, the method 100 continues with step 108, forming bond pad openings in the protective dielectric layer to expose the bond pads of the top metal layer by removing the protective dielectric layer in the bond pad openings. The bond pad opening may be etched by forming an etch mask over the protective dielectric layer which exposes the protective dielectric layer in areas for the bond pad openings. Subsequently, the protective dielectric layer is removed from the areas for the bond pad openings using an etch process, such as a reactive ion etch (RIE) process or a wet etch process combined with an RIE process. Etching the bond pad openings may be facilitated by an etch stop sublayer of the protective dielectric layer, formed on the top metal layer. The etch stop sublayer, if used, is removed from the areas for the bond pad openings.

The method 100 continues with step 110, forming a cap metal layer over the protective dielectric layer and on the top metal layer in the bond pad openings. The cap metal layer is electrically conductive, and may include two or more sublayers of metal, such as a barrier sublayer, an intermediate sublayer, and a bonding sublayer. The barrier sublayer may include, for example, titanium, tantalum, tungsten, titanium nitride, or tantalum nitride. The intermediate sublayer may include, for example, nickel or palladium. The bonding sublayer may include, for example, platinum or gold. In an alternative version of this example, the cap metal layer may include an adhesion sublayer of titanium nitride and a bonding sublayer of aluminum.

The method 100 continues with step 112, patterning the cap metal layer by removing the cap metal layer from over the protective dielectric layer outside the bond pad openings to form bond pad caps on the top metal layer in the bond pad openings. In versions of this example in which the cap metal layer includes platinum, the cap metal layer may be patterned by a chemical mechanical polish (CMP) process which removes the cap metal layer from a top surface of the protective dielectric layer, leaving the cap metal layer on the top metal layer in the bond pad openings to provide the bond pad caps. In versions of this example in which the cap metal layer includes aluminum or gold, the cap metal layer may be patterned by forming an etch mask over the bond pad openings and removing the cap metal layer outside the bond pad openings using an etch process to form the bond pad caps. Aluminum may be removed by an RIE process using chlorine. Gold may be removed by a wet etch process using potassium iodide or other complexing agent. Removing the cap metal layer by an etch process may leave a border of the cap metal layer on the top surface of the protective dielectric layer around the bond pad openings.

The method 100 may end with step 112, or may optionally continue with step 114, heating the semiconductor device after patterning the cap metal layer in a post-bake operation. The semiconductor device may be heated in the post-bake operation for a post-bake thermal profile sufficient to improve electrical contact between the cap metal layer and the top metal layer. The post-bake thermal profile applied in the post-bake operation is less than the sinter thermal profile applied in the sintering operation, to reduce unwanted movement in the top metal layer in contact with the cap metal layer. By way of example, the semiconductor device may be heated in the post-bake operation at about 200° C. for 30 minutes to 2 hours in an inert ambient such as nitrogen or argon.

Figure 3A:
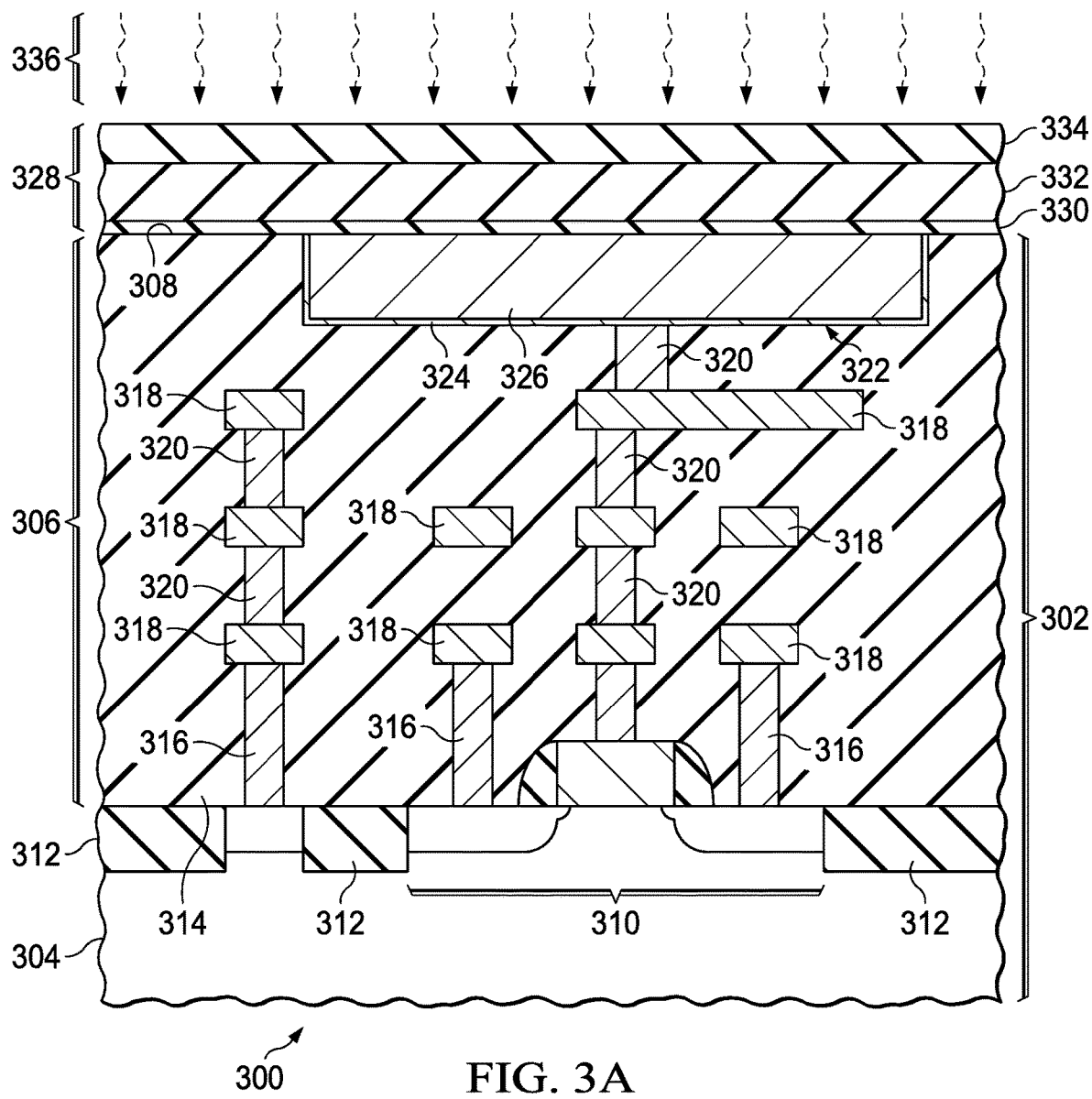
FIG. 3A through FIG. 3E are cross sections of a semiconductor device depicted in stages of an example method of formation.

FIG. 3A through FIG. 3E are cross sections of a semiconductor device depicted in stages of an example method of formation. Referring to FIG. 3A, a device substrate 302 is provided with the unfinished semiconductor device 300, referred to hereinafter as the semiconductor device 300. The semiconductor device 300 may be implemented as an integrated circuit or a discrete component, and the device substrate 302 may be part of a semiconductor wafer containing additional semiconductor devices, not shown in FIG. 3A. The device substrate 302 includes a semiconductor material 304 of the semiconductor device 300. The semiconductor material 304 may include crystalline silicon, or may include another semiconductor material, such as silicon germanium, silicon carbide, gallium nitride, or gallium arsenide, by way of example. The semiconductor device 300 includes an interconnect region 306 on the semiconductor material 304. The interconnect region 306 extends to a connection surface 308 of the semiconductor device 300. The semiconductor device 300 further includes an active component 310; in this example, the active component 310 is implemented as a metal oxide semiconductor (MOS) transistor 310 extending partway into the semiconductor material 304 and the interconnect region 306. Other implementations of the active component 310, such as a bipolar junction transistor, a diode, or a junction field effect transistor (JFET), are within the scope of this example. The semiconductor device 300 may include passive elements, such as field oxide 312 located at the boundary between the semiconductor material 304 and the interconnect region 306.

The interconnect region 306 includes a dielectric material stack 314 with dielectric sublayers of silicon dioxide, phosphosilicate glass (PSG), borophosphosilicate glass (BPSG), organosilicate glass (OSG), low-k dielectric material, silicon nitride, silicon oxynitride, silicon carbide, silicon carbide nitride, or other dielectric material. The interconnect region 306 includes electrically conductive elements, such as contacts 316 which make electrical connections to the active component 310 and the semiconductor material 304, interconnects 318 in one or more interconnect levels, wherein the interconnects 318 in a first of the interconnect levels make electrical connections to the contacts 316, and vias 320 which electrically connect the interconnects 318 in successive interconnect levels.

The semiconductor device 300 further includes a top metal layer 322 contacting the dielectric material stack 314 and exposed at the connection surface 308. The top metal layer 322 may be implemented as a copper damascene layer 322, with a liner 324 in a trench in the dielectric material stack 314 and a copper fill layer 326 on the liner 324, as depicted in FIG. 3A. In another version of this example, the top metal layer 322 may be implemented as a plated copper layer on a seed layer, extending above the connection surface 308. In a further version, the top metal layer 322 may be implemented as an aluminum layer on an adhesion layer, extending above the connection surface 308. Other implementations of the top metal layer 322, such as a tungsten layer, are within the scope of this example. While four levels of interconnect are shown, the number of interconnect levels varies depending on the application. Typically, between 2 and 9 levels of metal are used.

A protective dielectric layer 328 is formed over the top metal layer 322 and the connection surface 308. The protective dielectric layer 328 may optionally include an etch stop sublayer 330 formed on the top metal layer 322. The etch stop sublayer 330 may include silicon nitride, for example, formed by a plasma enhanced chemical vapor deposition (PECVD) process using dichlorosilane and ammonia, or bis(tertiary-butyl-amino) silane, $SiH_2[NH(C_4H_9)]_2$ (BTBAS). The etch stop sublayer 330 may have a thickness of 100 nanometers to 300 nanometers, by way of example. The protective dielectric layer 328 may include a first sublayer 332 formed on the etch stop sublayer 330 and a second sublayer 334 formed on the first sublayer 332. The first sublayer 332 may include silicon dioxide, formed by a PECVD process using tetraethyl orthosilicate (TEOS), $Si(OC_2H_5)_4$, and oxygen. The first sublayer 332 may have a thickness of 1 micron to 3 microns, by way of example. The second sublayer 334 may include silicon oxynitride, formed by a PECVD process using TEOS and BTBAS. The second sublayer 334 may have a thickness of 0.5 microns to 2 microns, by way of example. Other sublayer implementations for the protective dielectric layer 328, such as additional sublayers or other dielectric materials such as silicon carbide or aluminum oxide, are within the scope of this example. Alternatively, the protective dielectric layer 328 may be implemented with a single homogeneous layer of dielectric material.

After the protective dielectric layer 328 is formed, and while the protective dielectric layer 328 covers the top metal layer 322, a sintering operation 336 is performed which heats the semiconductor device with a sinter thermal profile sufficient to passivate the active component 310 of the semiconductor device 300. The sinter thermal profile may include heating the semiconductor device 300 as disclosed in reference to step 106 of FIG. 1. Having the full thickness of the protective dielectric layer 328 over the top metal layer 322 during the sintering operation 336 may accrue the advantage disclosed in reference to step 106.

Figure 3B:
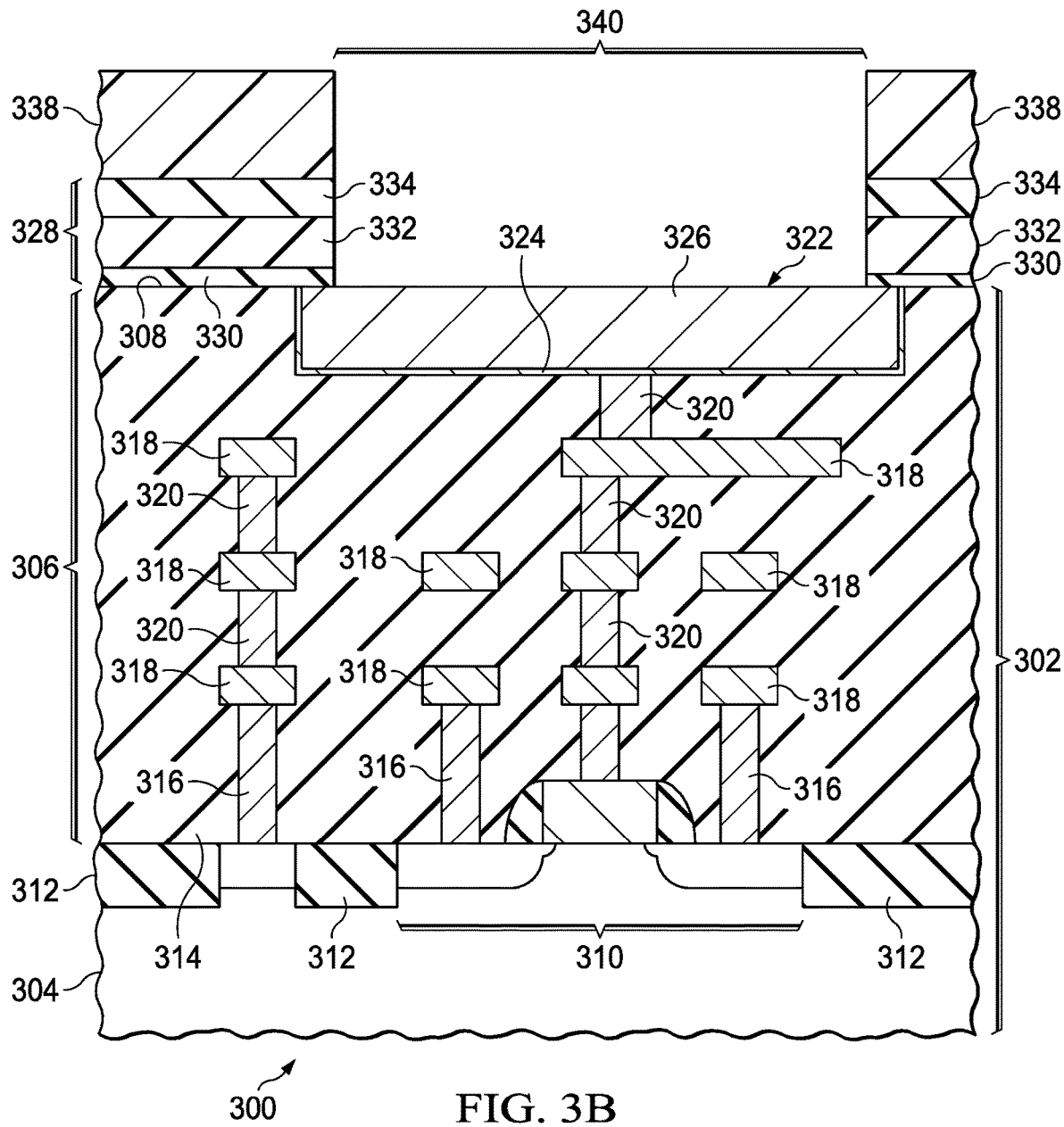

Referring to FIG. 3B, an etch mask 338 is formed over the protective dielectric layer 328, exposing the protective dielectric layer 328 over the top metal layer 322 in an area for a bond pad opening 340. The etch mask 338 may include photoresist and may be formed by a photolithographic process.

The protective dielectric layer 328 is removed where exposed by the etch mask 338 to form the bond pad opening 340, exposing the top metal layer 322 in the bond pad opening 340. The protective dielectric layer 328 may be removed by an RIE process, or by a wet etch process combined with an RIE process using fluorine. Etching the protective dielectric layer 328 while avoiding damage to the top metal layer 322 may be facilitated by the etch stop sublayer 330; silicon oxynitride in the second sublayer 334 and silicon dioxide in the first sublayer 332 may be removed by a first RIE process using fluorine at relatively high ion energies, stopping in the silicon nitride of the etch stop sublayer 330. Silicon nitride in the etch stop sublayer 330 may subsequently be removed by a second RIE process using fluorine at lower ion energies.

After the protective dielectric layer 328 is removed from the bond pad opening 340, the etch mask 338 is removed. The etch mask 338 may be removed by an oxygen plasma process such as an asher process, or a downstream asher process, by way of example.

Figure 3C:
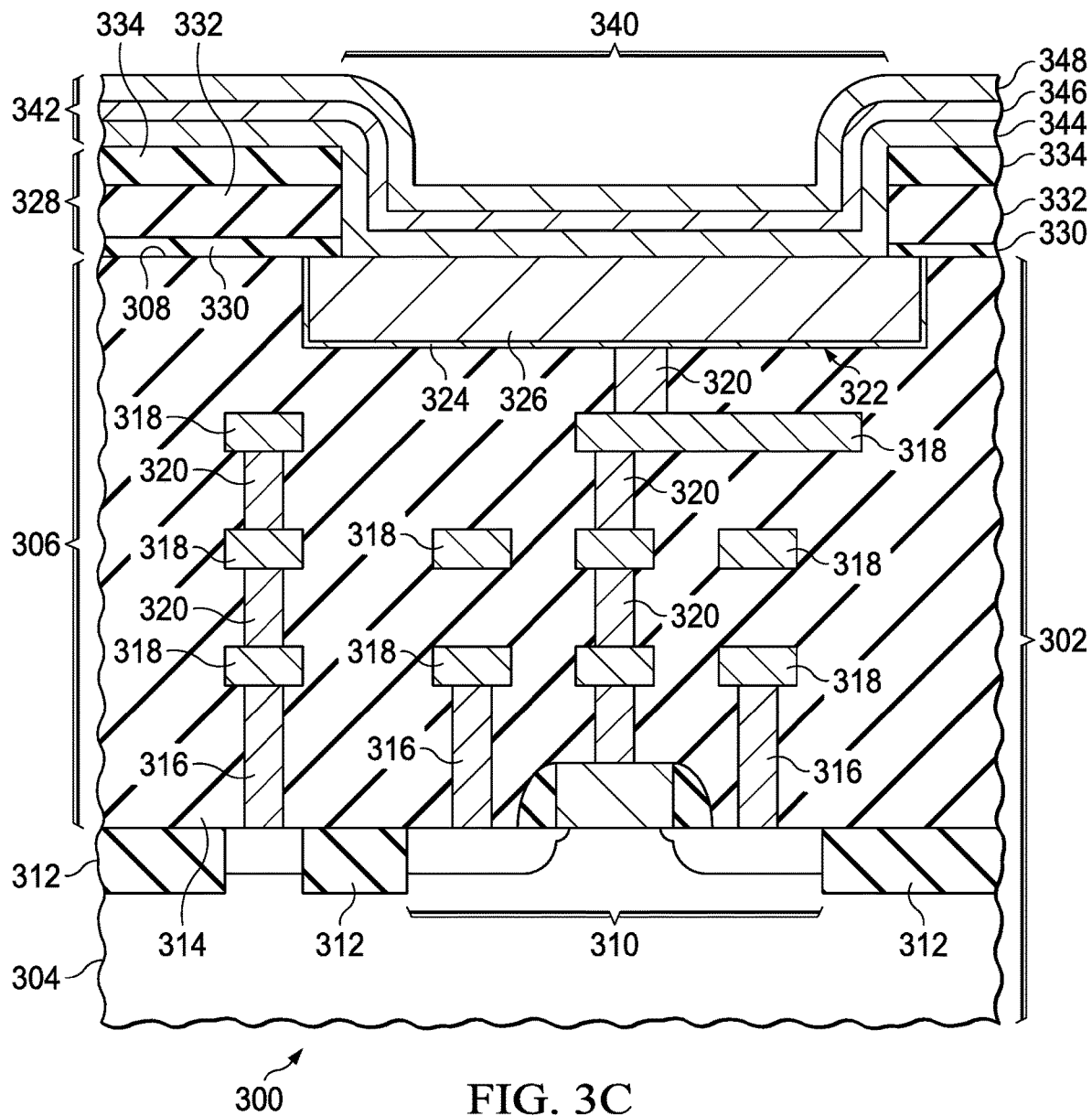

Referring to FIG. 3C, a cap metal layer 342 is formed over the protective dielectric layer 328, extending into the bond pad opening 340, and contacting the top metal layer 322. The cap metal layer 342 is electrically conductive, to provide an electrical connection to the top metal layer 322. The cap metal layer 342 of this example includes a barrier sublayer 344 that contacts the top metal layer 322, an intermediate sublayer 346 on the barrier sublayer 344, and a bonding sublayer 348 on the intermediate sublayer 346. The barrier sublayer 344 may include any of the metals disclosed in reference to step 110 of FIG. 1. The barrier sublayer 344 may be formed by one or more sputter processes, for example. The barrier sublayer 344 may have a thickness of 20 nanometers to 200 nanometers, by way of example. The intermediate sublayer 346 may include any of the metals disclosed in reference to step 110 of FIG. 1. The intermediate sublayer 346 may be formed by one or more sputter processes, for example. The intermediate sublayer 346 may have a thickness of 20 nanometers to 5 microns, by way of example. The bonding sublayer 348 may include any of the metals disclosed in reference to step 110 of FIG. 1, and may have a thickness of 100 nanometers to 5 microns, for example. The bonding sublayer 348 may be formed by a sputter process, a plating process, or an evaporation process, for example.

Figure 3D:
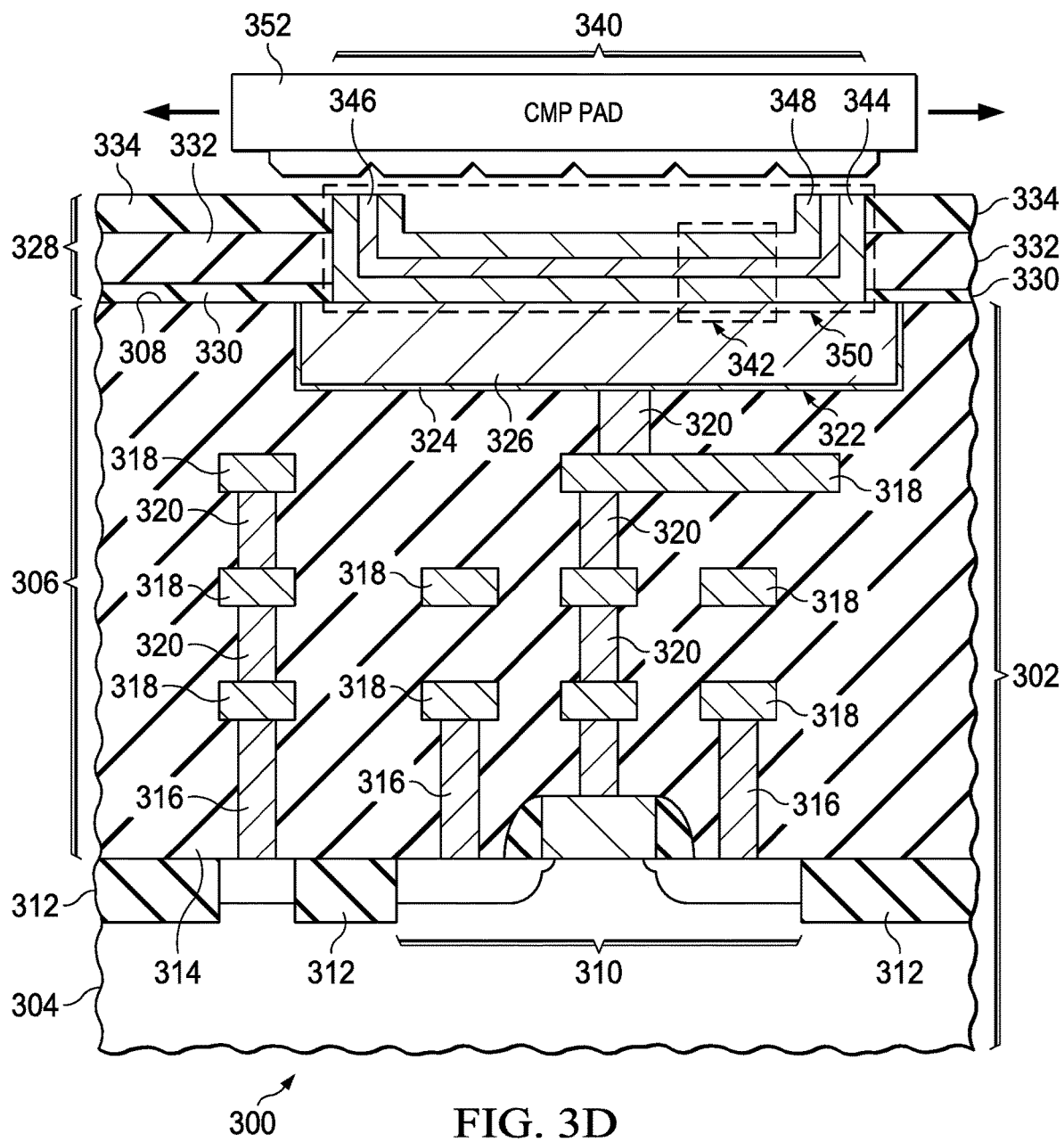

Referring to FIG. 3D, the cap metal layer 342 is patterned by removing the cap metal layer 342 outside the bond pad opening 340, leaving the cap metal layer on the top metal layer 322 in the bond pad opening 340 to form a bond pad cap 350. The cap metal layer 342 may be patterned by a CMP operation using a CMP pad 352, as depicted in FIG. 3D, which removes the cap metal layer 342 from over the protective dielectric layer 328, leaving the cap metal layer 342 in the bond pad opening 340. Alternatively, the cap metal layer 342 may be patterned by forming a bond pad etch mask over the cap metal layer 342, covering the bond pad opening 340. The bond pad etch mask may extend over the protective dielectric layer 328 by a few microns around the bond pad opening 340. The cap metal layer 342 is removed by an etch process where exposed by the bond pad etch mask. The bond pad etch mask may include photoresist and may be formed by a photolithographic operation.

Figure 3E:
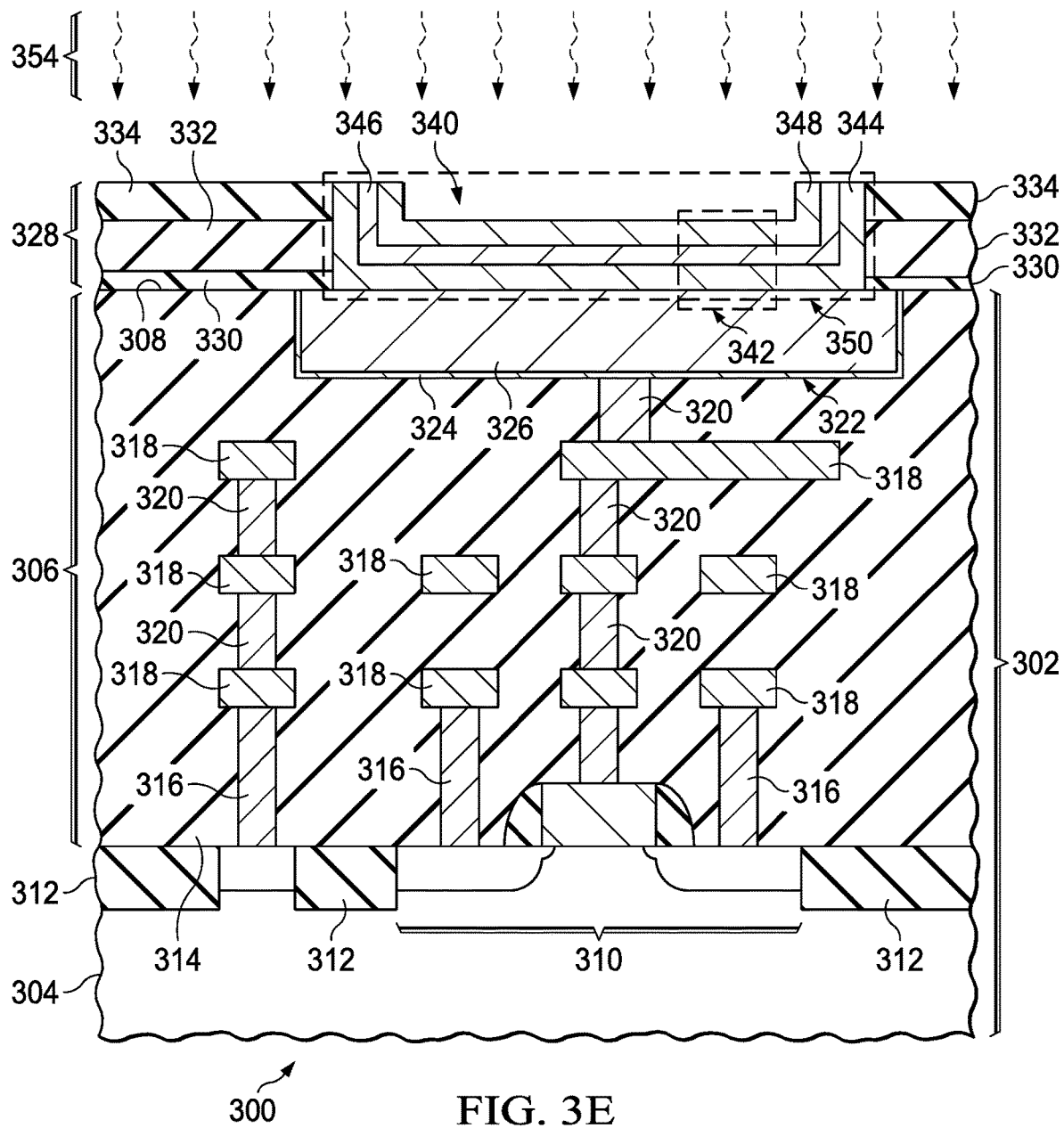

Referring to FIG. 3E, the semiconductor device 300 may optionally be heated in a post-bake operation 354 after the cap metal layer 342 is patterned. A post-bake thermal profile applied in the post-bake operation 354 is less than the sinter thermal profile applied in the sintering operation, to reduce unwanted movement in the top metal layer in contact with the cap metal layer. By way of example, the semiconductor device may be heated in the post-bake operation 354 at about 200° C. for 30 minutes to 2 hours in an inert ambient such as nitrogen or argon, sufficient to improve electrical contact between the cap metal layer and the top metal layer.

In this disclosure and the claims that follow, one or more layers or structures may be described as including substances such as aluminum, tungsten, copper, silicon nitride, etc. These descriptions are to be understood in context and as they are used in the semiconductor manufacturing industry. For example, in the semiconductor industry, when a metallization layer is described as copper, it is understood that the metal of the layer includes copper as a principle component, but the copper may be, and typically is, alloyed, doped, or otherwise impure. As another example, silicon nitride may be a silicon-rich silicon nitride or an oxygen-rich silicon nitride. Silicon nitride may contain some oxygen, but not so much that the materials dielectric constant is substantially different from that of high purity stoichiometric silicon nitride.

Additionally, unless stated otherwise and/or specified to the contrary, any one or more of the layers set forth herein can be formed in any number of suitable ways, such as with spin-on techniques, sputtering techniques (e.g., Magnetron and/or ion beam sputtering), (thermal) growth techniques and/or deposition techniques such as chemical vapor deposition (CVD), physical vapor deposition (PVD), PECVD, or atomic layer deposition (ALD), for example.

It is noted that terms such as top, over, above, underlying, and below may be used in this disclosure. These terms should not be construed as limiting the position or orientation of a structure or element, but should be used to provide spatial relationship between structures or elements.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming a semiconductor device, comprising:
    forming an active component in a semiconductor substrate;
    forming an interconnect layer on the semiconductor substrate, the interconnect layer including a top copper structure laterally surrounded by a dielectric material of the interconnect layer, the top copper structure having a surface that is flush with the dielectric material;
    forming a protective dielectric layer on the surface of the top copper structure;
    applying a first thermal process to the semiconductor substrate while the protective dielectric layer completely covers the surface of the top copper structure, wherein the first thermal process includes a first thermal profile selected to passivate the active component while the protective dielectric layer at least partially prevents movement in the top copper structure during application of the first thermal process;
    after applying the first thermal process, forming a bond pad opening in the protective dielectric layer to expose a portion of the surface, the bond pad opening including a sidewall that is perpendicular to the surface, wherein the sidewall extends to a first height with respect to the surface;
    forming a bond pad cap in the bond pad opening, the bond pad cap being in contact with the surface of the top copper structure, and including a portion that is perpendicular to the surface, wherein the portion extends to a second height with respect to the surface, the second height being equal to or less than the first height, and wherein one or more sputter processes are used to form the bond pad cap on the surface of the top copper structure; and
    applying a second thermal process to the semiconductor substrate after forming the bond pad cap, wherein the second thermal process includes a second thermal profile less than the first thermal profile, the second thermal profile selected to increase an electrical contact between the top copper structure and the bond pad cap while reducing movement in the top copper structure.

2. The method of claim 1, wherein the second thermal profile of the second thermal process is insufficient to passivate the active component.

3. The method of claim 1, wherein the first thermal process includes heating the semiconductor substrate to a sinter temperature for a sinter time, wherein a product of the sinter time, in minutes, and an Arrhenius factor of the sinter temperature is greater than 0.0027 minutes, the Arrhenius factor of the sinter temperature being determined by an expression:

Arrhenius factor=$\exp(-E_A/(k \times (375+T_s)))$;

where:

exp is the exponential function;

EA=0.8×10⁻¹⁹ joules, corresponding to 0.5 electron volts;

k=1.38×10⁻²³ joules/° C.; and $T_s$ is the sinter temperature in ° C.

4. The method of claim 1, wherein the first thermal process includes heating the semiconductor substrate to a temperature of at least 400° C. for a time of at least 15 minutes.

5. The method of claim 1, wherein the first thermal process includes heating the semiconductor substrate to a temperature of at least 350° C. for a time of at least 30 minutes.

6. The method of claim 1, wherein the first thermal process includes heating the semiconductor substrate to a temperature of at least 300° C. for a time of at least 68 minutes.

7. The method of claim 1, wherein forming the protective dielectric layer includes forming a first sublayer over the top copper structure, and includes forming a second sublayer on the first sublayer.

8. The method of claim 7, wherein the first sublayer includes silicon oxynitride and the second sublayer includes silicon dioxide.

9. The method of claim 7, wherein forming the protective dielectric layer includes forming an etch stop sublayer over the top copper structure, and forming the first sublayer on the etch stop sublayer.

10. The method of claim 1, wherein forming the bond pad cap includes:

forming a cap metal layer over the protective dielectric layer and on the top copper structure in the bond pad opening, the cap metal layer including platinum; and removing the cap metal layer from over the protective dielectric layer outside the bond pad opening by using a chemical mechanical polish process.

11. The method of claim 10, wherein forming the cap metal layer includes:

depositing a barrier sublayer on the top copper structure, the barrier sublayer formed by a first sputter process, and including titanium, tungsten, titanium nitride, or tantalum nitride;

depositing an intermediate sublayer on the barrier sublayer, the intermediate sublayer formed by a second sputter process, and including nickel or palladium; and depositing a bonding sublayer on the intermediate sublayer, the bonding sublayer formed by a third sputter process and including platinum.

12. The method of claim 1, wherein forming the bond pad cap includes:

forming a cap metal layer over the protective dielectric layer and on the top copper structure in the bond pad opening, the cap metal layer including aluminum or gold; and removing the cap metal layer from over the protective dielectric layer outside the bond pad opening by using an etch process.

13. The method of claim 12, wherein forming the cap metal layer includes:

depositing a barrier sublayer on the top copper structure, the barrier sublayer formed by a first sputter process, and including titanium, tantalum, tungsten, titanium nitride, or tantalum nitride;

depositing an intermediate sublayer on the barrier sublayer, the intermediate sublayer formed by a second sputter process, and including nickel or palladium; and depositing a bonding sublayer on the intermediate sublayer, the bonding sublayer formed by a third sputter process and including aluminum or gold.

14. The method of claim 1, wherein the protective dielectric layer includes silicon carbide or aluminum oxide.

15. The method of claim 9, wherein the etch stop sublayer includes silicon nitride, and wherein removing the protective dielectric layer from the bond pad opening in the protective dielectric layer includes:

etching the first and second sublayers of the protective dielectric layer by a first reactive ion etching (RIE) process using fluorine at a first ion energy; and etching the etch stop sublayer by a second RIE process using fluorine at a second ion energy that is less than the first ion energy.

16. The method of claim 1, wherein the second thermal process includes heating the semiconductor substrate at about 200° C. for 30 minutes to 2 hours in nitrogen or argon ambient.

17. A method of forming a semiconductor device, comprising:

forming an active component in a semiconductor substrate;

forming an interconnect layer on the semiconductor substrate, the interconnect layer including a copper structure laterally surrounded by a dielectric material of the interconnect layer, the copper structure having a surface flush with the dielectric material;

forming a protective dielectric layer on the copper structure;

heating the semiconductor substrate in a first operation while the protective dielectric layer covers the copper structure, wherein the first operation comprises a first thermal profile that includes heating the semiconductor substrate to a temperature of at least 300° C. for a time of at least 68 minutes, the first thermal profile selected to passivate the active component while the protective dielectric layer at least partially prevents movement in the copper structure during application of the first operation;

after the first operation, removing a portion of the protective dielectric layer to form a bond pad opening in the protective dielectric layer, the bond pad opening exposing a portion of the copper structure, and including a sidewall that is perpendicular to the surface, wherein the sidewall extends to a first height with respect to the surface;

forming a bond pad cap in the bond pad opening, the bond pad cap being in contact with the copper structure and including a portion that is perpendicular to the surface, wherein the portion extends to a second height with respect to the surface, the second height being equal to or less than the first height, and wherein one or more sputter processes are used to form the bond pad cap on the surface of the copper structure; and heating the semiconductor device after forming the bond pad cap in a second operation having a second thermal profile that is less than the first thermal profile of the first operation, before forming a bond to the bond pad cap, the second thermal profile selected to increase an electrical contact between the copper structure and the bond pad cap while reducing movement in the copper structure.

18. The method of claim 17, wherein the second thermal profile of the second operation is insufficient to passivate the active component.

19. A method of forming a semiconductor device, comprising:
- forming an active component in a semiconductor substrate;
- forming an interconnect layer on the semiconductor substrate, the interconnect layer including a copper structure laterally surrounded by a dielectric material of the interconnect layer, the copper structure having a surface that is flush with the dielectric material;
- forming a protective dielectric layer on the copper structure;
- applying a first thermal process to the semiconductor substrate in an ambient comprising argon or helium while the protective dielectric layer covers the copper structure, wherein the first thermal process includes a first thermal profile selected to passivate the active component while the protective dielectric layer at least partially prevents movement in the copper structure during application of the first thermal process;
- after applying the first thermal process, removing a portion of the protective dielectric layer to form a bond pad opening in the protective dielectric layer, the bond pad opening exposing a portion of the copper structure and including a sidewall that is perpendicular to the surface, wherein the sidewall extends from the surface to a first height;
- forming a bond pad cap in the bond pad opening, the bond pad cap being in contact with the copper structure, and including a portion that is perpendicular to the surface, wherein the portion extends form the surface to a second height that is equal to or less than the first height, and wherein one or more sputter processes are used to form the bond pad cap on the surface of the copper structure; and
- applying a second thermal process to the semiconductor substrate after forming the bond pad cap, the second thermal process having a second thermal profile that is less than the first thermal process, before forming a bond to the bond pad cap, the second thermal profile selected to increase an electrical contact between the copper structure and the bond pad cap while reducing movement in the copper structure.

* * * * *